United States Patent [19]

Shimizu

[11] Patent Number: 4,973,962
[45] Date of Patent: Nov. 27, 1990

[54] SIGNAL LEVEL DETECT CIRCUITS
[75] Inventor: Yoshio Shimizu, Kanagawa, Japan
[73] Assignee: Sony Corporation, Tokyo, Japan
[21] Appl. No.: 471,598
[22] Filed: Jan. 29, 1990
[30] Foreign Application Priority Data
  Feb. 1, 1989 [JP] Japan .................................. 64-023054
[51] Int. Cl.$^5$ ............................................. H03M 1/56
[52] U.S. Cl. ..................................... 341/166; 307/355
[58] Field of Search ............... 341/110, 126, 155, 158, 341/164, 166; 307/106, 107, 355, 356

[56] References Cited
U.S. PATENT DOCUMENTS 3,999,123 12/1976 Thoener ............................... 341/166
4,210,903 7/1980 LaBrie .................................. 341/164
4,565,992 1/1986 Sakamoto et al. .................... 341/164
4,675,649 6/1987 Forehand et al. .................... 341/161

Primary Examiner—Vit W. Miska
Attorney, Agent, or Firm—Hill, Van Santen, Steadman & Simpson

[57] ABSTRACT

A signal level detecting circuit comprises an input terminal to which an input signal with level variations is applied, a level comparator operative to compare the level of the input signal with the level of a reference signal variable in level and to produce a comparison output signal having first and second levels in response to differences between the level of the input signal and the level of the reference signal, a control signal generator operative to produce control signals one of which is obtained when a period of time in which the comparison output signal has the first level is not longer than one of two different reference periods of time and the other of which is obtained when the period of time in which the comparison output signal has the first level is not shorter than the other of two different reference periods of time, a pulse generator operative to produce a pulse signal having its pulse duty factor varied in response to the control signals obtained from the control signal generator, and an integrator operative to produce an integration output signal based on the pulse signal obtained from the pulse generator and to supply the level comparator with the integration output signal as the reference signal.

5 Claims, 3 Drawing Sheets

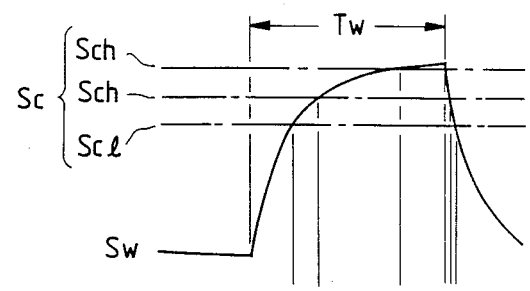
FIG. 4A
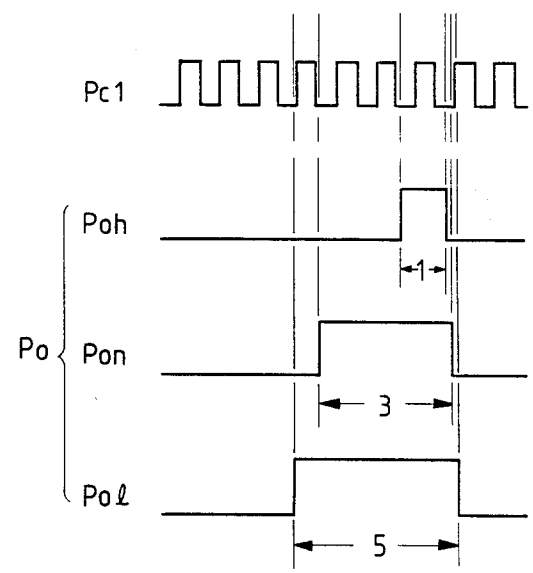
FIG. 4B
FIG. 4C
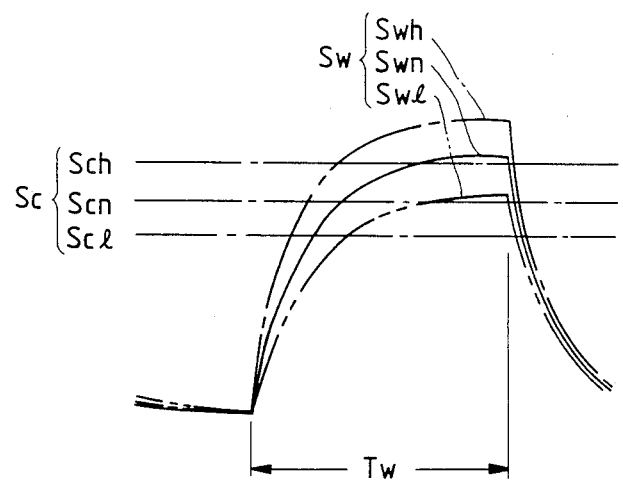
FIG. 5

SIGNAL LEVEL DETECT CIRCUITS

BACKGROUND OF THE INVENTION

1. Field of the Invention

The present invention relates generally to signal level detecting circuits for detecting levels of analog signals, and more particularly, to a circuit for detecting the level of an analog signal, such as a variable control signal, and producing a detected output signal which can be digitally processed.

2. Description of Related Art

In a previously proposed circuit for detecting the level of an analog signal and for producing a detected output signal which is formed so as to be digitally processed, it is customary that the analog signal which has a level that is to be detected is subjected to an analog-to-digital (A/D) conversion so as to produce a digital signal which corresponds thereto and the level of the analog signal is indirectly detected based on the digital signal obtained by the A/D conversion. For example, in the case where the brightness of the display of a fluorescent display tube which is used in an electronic apparatus and which is driven by a digitalized driving circuit that is controlled by an analog control signal, the level of the analog control signal is indirectly detected in such a manner that the analog control signal is subjected to an A/D conversion so as to produce a digital signal which corresponds to the level of the analog control signal, and the digital signal obtained during the A/D conversion is supplied to the digitalized driving circuit so as to carry out the brightness control for the fluorescent display tube.

In such a case, it is usual that the A/D conversion is carried out by an A/D converter formed as an integrated circuit and the A/D converter employed in conventional consumer product electronic apparatus is commonly a microcomputer of, for example, the eight bit type.

In the case where the A/D converter contained in the microcomputer of the eight bit type is used for detecting the level of the analog control signal, it is possible that the number of conversion steps for digitalization are insufficient for a sufficient range of level variations in the analog control signal and therefore the level of the analog control signal will be detected with insufficient accuracy. If such insufficiency in the number of conversion steps for digitalization results in the brightness control for a fluorescent display tube, the brightness of the display on the fluorescent display tube does not change smoothly in accordance with variations in the level of the analog control signal but will have unnatural sudden changes in response to the variations in the level of the analog control signal.

For avoiding such a problem, it is considered to use an A/D converter which has more than eight bit numbers for the A/D conversion of the analog control signal. However, A/D converters with more than eight bit numbers require a large number of electronic elements and parts which results in complicated and expensive devices.

SUMMARY OF THE INVENTION

Accordingly, it is an object of the present invention to provide a signal level detecting circuit which is operative to detect the level of an analog signal and to produce a detected output signal which is applicable to a digital processing circuit, which avoids the aforementioned problems and disadvantages encountered with the prior art.

Another object of the present invention is to provide a signal level detecting circuit operative to detect the level of an analog signal and to produce a detected output signal which is applicable to a digital processing circuit, in which the level of the analog signal is accurately detected and which has a relatively simple and inexpensive configuration.

A further object of the present invention is to provide a signal level detecting circuit operative to detect the level of an analog signal and to produce a detected output signal which is applicable to a digital processing circuit, in which the level of the analog signal is accurately detected without an A/D converter which has more than eight bits for the A/D conversion of the analog signal.

According to the present invention, there is provided a signal level detecting circuit comprising an input terminal to which an input signal with level variations is applied. A level comparator having first and second input terminals is supplied with the input signal and a reference signal, respectively, and is operative to produce a first comparison output signal which has a first level during first periods of time wherein the level of the input signal is equal to or lower than the level of the reference signal and a second level during periods of time other than the first periods of time or to produce a second comparison output signal which has a first level during second periods of time wherein the level of the input signal is equal to or higher than the level of the reference signal and the second level during periods of time other than the second periods of time. A control signal generator is operative to detect the first or second period of time and to produce a first control signal when the detected first or second period of time is shorter than a first reference period of time and a second control signal when the detected first or second period of time is longer than a second reference period of time which is selected to be longer than the first reference period of time or to produce a third control signal when the detected first or second period of time is longer than a third reference period of time and a fourth control signal when the detected first or second period of time is shorter than a fourth reference period of time which is selected to be shorter than the third reference period of time. A pulse generator is operative to produce a pulse signal having a period determined based on a predetermined clock signal and a pulse duty factor arranged to be variable during a given period of time at regular intermittent intervals, to increase or decrease the pulse duty factor of the pulse signal whenever the first or third control signal is obtained from the control signal generator and to decrease or increase the pulse duty factor of the pulse signal whenever the second or fourth control signal is obtained from the control signal generator. An integrator is operative to produce an integrated output signal based on the pulse signal obtained from the pulse generator during the given period of time and to supply the second input terminal of the level comparator with the integrated output signal as the reference signal.

In the signal level detecting circuit thus constituted in accordance with the present invention, the integrated output signal which is supplied to the second input terminal of the level comparator as the reference signal has its level varied in response to variations in the pulse duty factor of the pulse signal obtained from the pulse generator during the given period of time. The first period of time in which the first comparison output signal obtained from the level comparator has the first level or the second period of time in which the second comparison output signal obtained from the level comparator has the first level is varied in its length in response to level variations of the input signal compared with the level of the integrated output signal.

Whenever the level of the input signal applied to the input terminal increases so that the first period of time wherein the first comparison output signal has the first level or the second period of time wherein the second comparison output signal has the first level is shorter than the first reference period of time and thereby the first control signal is obtained from the control signal generator, the pulse duty factor of the pulse signal obtained from the pulse generator is increased or decreased and thereby the level of the integrated output signal which is supplied to the second input terminal of the level comparator is increased, so that the first period of time or the second period of time is varied to be longer than the first reference period of time, and whenever the level of the input signal applied to the input terminal decreases so that the first period of time wherein the first comparison output signal has the first level or the second period of time wherein the second comparison output signal has the first level is longer than the second reference period of time which is selected to be longer than the first reference period of time and thereby the second control signal is obtained from the control signal generator, the pulse duty factor of the pulse signal obtained from the pulse generator is decreased or increased and thereby the level of the integrated output signal supplied to the second input terminal of the level comparator is decreased, so that the first period of time or the second period of time is varied so as to be shorter than the second reference period of time.

Otherwise, whenever the level of the input signal applied to the input terminal increases so that the first period of time wherein the first comparison output signal has the first level or the second period of time wherein the second comparison output signal has the first level is longer than the third reference period of time and thereby the third control signal is obtained from the control signal generator, the pulse duty factor of the pulse signal obtained from the pulse generator is increased or decreased and thereby the level of the integrated output signal supplied to the second input terminal of the level comparator is increased, so that the first period of time or the second period of time is varied so as to be shorter than the third reference period of time, and whenever the level of the input signal applied to the input terminal decreases so that the first period of time wherein the first comparison output signal has the first level or the second period of time wherein the second comparison output signal has the first level is shorter than the fourth reference period of time which is selected to be shorter than the third reference period of time and thereby the fourth control signal is obtained from the control signal generator, the pulse duty factor of the pulse signal obtained from the pulse generator is decreased or increased and thereby the level of the integrated output signal supplied to the second input terminal of the level comparator is decreased, so that the first period of time or the second period of time is varied so as to be longer than the fourth reference period of time.

With the operation as described above, the first or third control signal is obtained from the control signal generator in response to an increase of the level of the input signal and the second or fourth control signal is obtained from the control signal generator in response to a decrease of the level of the input signal. These first and second control signals or third and fourth control signals are produced by detecting the level of the input signal at a large number of level steps as the detected output signals which are applicable to the digital processing circuit.

In such a manner as aforementioned, the level of the input signal applied to the input terminal is accurately detected to produce the detected output signal which is applicable to the digital processing circuit with relatively simple and inexpensive configurations without using an A/D converter which has more than eight bits for carrying out the A/D conversion of an analog signal.

The above, and other objects, features and advantages of the present invention will become apparent from the following detailed description which is to be read in conjunction with the accompanying drawings.

BRIEF DESCRIPTION OF THE DRAWINGS

FIGS. 2, 3, 4A, 4B, 4C and 5 are waveform diagrams used for explaining the operation of the embodiment shown in FIG. 1.

DESCRIPTION OF THE PREFERRED EMBODIMENTS

Figure 1:
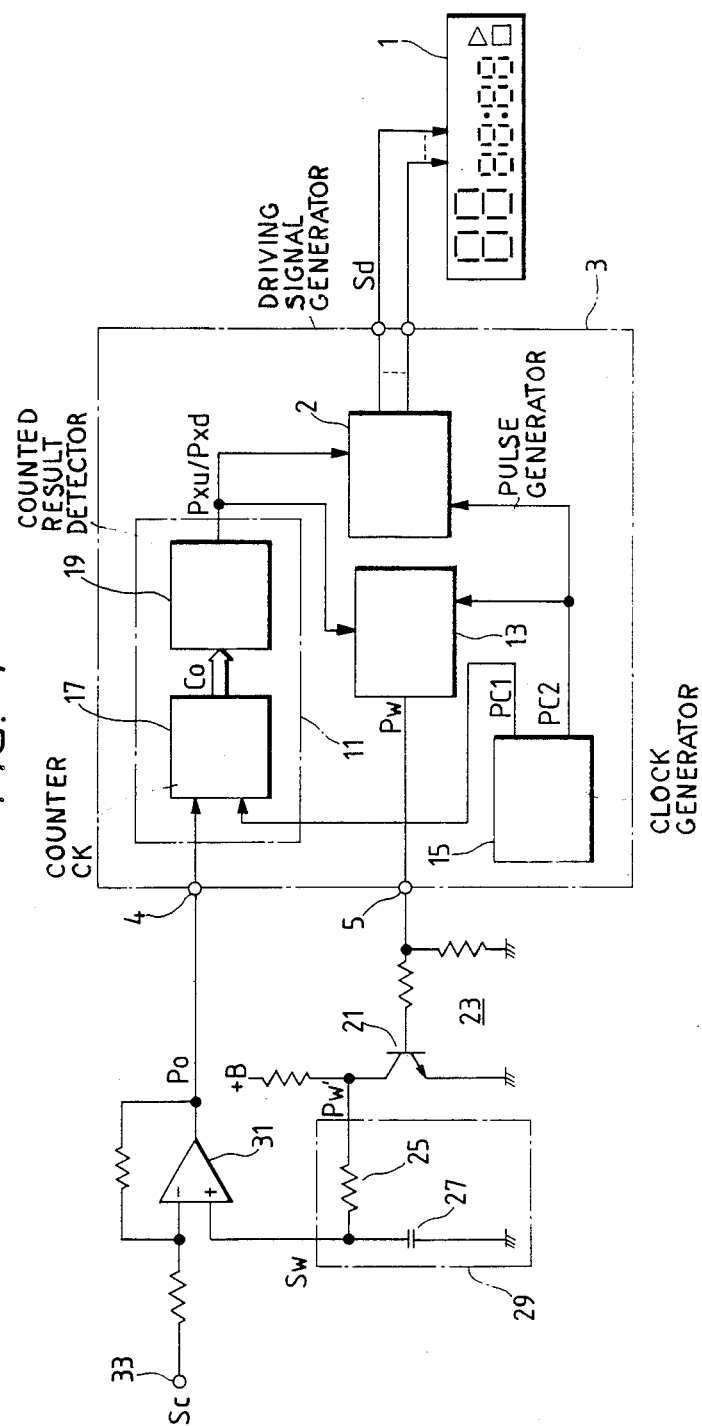
FIG. 1 is a schematic block diagram showing an embodiment of the signal level detecting circuit according to the present invention, together with a display device to which the embodiment is applied.

FIG. 1 shows an embodiment of signal level detecting circuit according to the present invention and a display device to which the embodiment is applied.

Referring to FIG. 1, the display device comprises a fluorescent display tube 1 and a control unit 3 which includes a driving signal generator 2 operative to supply the fluorescent display tube 1 with a driving signal Sd to control the brightness of the display of a plurality of fluorescent elements provided in the fluorescent display tube 1.

The control unit 3 also includes a control signal generator 11 and a pulse generator 13 which constitute a part of the embodiment of the signal level detecting circuit according to the present invention, and further a clock generator 15 which supplies the control signal generator 11 with a clock signal Pc1 and also supplies both the driving signal generator 2 and the pulse generator 13 which are in the control unit 3 with a clock signal Pc2. The control signal generator 11 comprises a counter 17 to which the clock signal Pc1 is supplied and a counted result detector 19 to which a count output Co from the counter 17 is supplied. The counted result detector 19 is operative to detect a counted result represented by the count output Co from the counter 17. The counter 17 supplies both the driving signal generator 2 and the pulse generator 13 with a first control signal Pxu or a second control signal Pxd as the output signal from the control signal generator 11.

A buffer amplifier 23 comprising a transistor 21 connected to a voltage source +B, an integrator 29 comprising a resistor 25 with one end connected to the transistor 21 and a capacitor 27 connected between the other end of the resistor 25 and a reference potential point, and a level comparator 31, which constitute a part of the embodiment of the signal level detecting circuit according to the present invention, are connected to the control unit 3. An input terminal of the buffer amplifier 23 is coupled through a terminal 5 to an output terminal of the pulse generator 13. An output terminal of the buffer amplifier 23 is coupled to an input terminal of the integrator 29. An output terminal of the integrator 29 is coupled to a reference input terminal of the level comparator 31. An output terminal of the level comparator 31 is coupled through a terminal 4 to the counter 17 in the control signal generator 11. Further, a comparing input terminal of the level comparator 31 is coupled to an input terminal 33 to which an external control signal Sc which has level variations is applied as the input signal.

Figure 2:
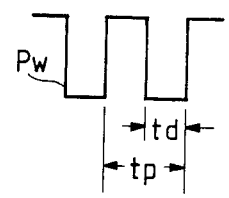
Figure 3:
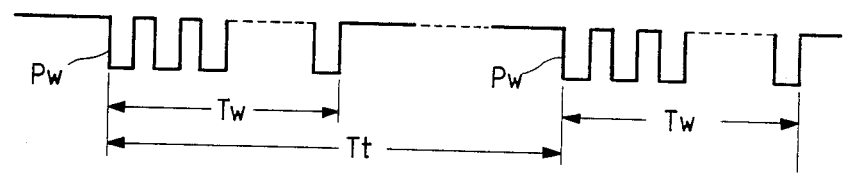

The pulse generator 13 in the control unit 3 supplies the buffer amplifier 23 with a pulse signal Pw through the terminal 5. As shown in FIGS. 2 and 3, the pulse signal Pw has a given period tp based on the clock signal Pc2 from the clock generator 15 and a variable pulse duty factor defined by td/tp ×100(%) and is produced during a given period of time Tw at regular intermittent intervals corresponding to a given period Tt. The pulse signal Pw supplied to the buffer amplifier 23 is inverted in polarity to become a pulse signal Pw' which is supplied to the integrator 29 from the output terminal of the buffer amplifier 23.

In the integrator 29, the pulse signal Pw' obtained in each period of time Tw is integrated to produce an integrated output signal Sw which is supplied to the reference input terminal of the level comparator 31. As shown in FIG. 4A, the integrated output signal Sw has a level which increases exponentially during the period Tw and it then decreases exponentially after the period Tw. The level of the integrated output signal Sw increases as the pulse duty factor of the pulse signal Pw increases.

The external control signal Sc is supplied to the comparing input terminal of the level comparator 31. In the level comparator 31, the level of the external control signal Sc is compared with the level of the integrated output signal Sw and a comparison output signal Po which has a high level when the level of the external control signal Sc is equal to or lower than the level of the integration output signal Sw and a low level when the level of the external control signal Sc is higher than the level of the integration output signal Sw, is obtained at the output terminal of the level comparator 31. This is supplied through terminal 4 to the counter 17 in the control signal generator 11 in the control unit 3.

The counter 17 counts pulses which form the clock signal Pc1 as shown in FIG. 4B which are supplied to a clock terminal CK during each counting period in which the comparison output signal Po has a high level and produces the count output Co which represents the counted result. In such a case, as shown in FIGS. 4A, 4B and 4C, the comparison output signal Po is formed into a signal Poh having a high level during a relatively short period of time when the external control signal Sc constitutes a signal Sch having a relatively high level in relation to the level of the integrated output signal Sw, and into a signal Pon having a high level during a medium period of time when the external control signal Sc constitutes a signal Scn which has a medium level in relation to the level of the integrated output signal Sw, and into a signal Pol having a high level during a relatively long period of time when the external control signal Sc constitutes a signal Scl having a relatively low level in relation to the level of the integrated output signal Sw. When the comparison output signal Po is formed into the signal Poh, one pulse of the clock signal Pc1 is counted in the counter 17 and the count output Co representing "1" is obtained from the counter 17. When the comparison output signal Po is formed into the signal Poh, three pulses of the clock signal Pc1 are counted in the counter 17 and the count output Co representing "3" is obtained from the counter 17, and when the comparison output signal Po is formed into the signal Pol, five pulses of the clock signal Pc1 are counted in the counter 17 and the count output Co representing "5" is obtained from the counter 17. The count output Co is reset after each period of time Tw.

Further, when the external control signal Sc has its level higher that the level of the signal Sch and therefore the comparison output signal Po has a high level during a considerably short period of time compared with the signal Poh or does not have a high level, the count output Co representing "0" is obtained from the counter 17. On the other hand, when the external control signal Sc has its level lower than the level of the signal Scl and therefore the comparison output signal Po has a high level during a considerably long period of time compared with the signal Pol, the count output Co representing a number more than "6" is obtained from the counter 17.

Accordingly, the counter 17 is operative to produce the count output Co which represents the count result corresponding to each counting period in which the comparison output signal Po has a high level, so as to detect the length of the counting period.

The count output Co is supplied to the counted result detector 19 which detects the counted result represented by the count output Co. The counted result detector 19 produces the first control signal Pxu when the counted result detected by the counted result detector 19 is "1" or "0", that is, the counting period of time is shorter than a first predetermined reference period of time. The second control signal Pxd is produced when the counted result detected by the counted result detector 19 is equal to or more than "5", that is, the counting period of time is longer than a second predetermined reference period of time which is selected to be longer than the first predetermined reference period. Further, the counted result detector 19 does not produce any control signal when the counted result detected by the counted result detector 19 is "2", "3" or "4".

Consequently, the first control signal Pxu is obtained from the counted result detector 19 when the external control signal Sc has its level equal to or higher than the level of the signal Sch during each period of time Tw, and the second control signal Pxd is obtained from the counted result detector 19 when the external control signal Sc has its level equal to or lower than the level of the signal Scl during each period of time Tw. This means that the first control signal Pxu is obtained from the counted result detector 19 in response to an increase in the level of the external control signal Sc and the second control signal Pxd is obtained from the counted result detector 19 in response to a decrease in the level of the external control signal Sc, so both first and second control signals Pxu and Pxd act as the level detected output signal in respect of the external control signal Sc.

Each of the first and second control signals Pxu and Pxd is supplied to the pulse generator 13 and the pulse generator 13 is operative to increase the pulse duty factor of the pulse signal Pw in response to the first control signal Pxu and to decrease the pulse duty factor of the pulse signal Pw in response to the second control signal Pxd. Accordingly, the pulse duty factor of the pulse signal Pw is increased so that the integrated output signal Sw obtained from the integrator 29 is increased in level in a manner such as to change to a signal Swh shown in FIG. 5 from a signal Swn shown in FIG. 5 when the external control signal Sc has its level equal to or higher than the level of the signal Sch, and it is decreased so that the integrated output signal Sw obtained from the integrator 29 is decreased in level in such a manner so as to change to a signal Swl shown in FIG. 5 from the signal Swn shown in FIG. 5, when the external control signal Sc has its level equal to or lower than the level of the signal Scl. As a result, a condition such that the level of the external control signal Sc which has a medium level in relation to the level of the integrated output signal Sw is compared with the level of the integrated output signal Sw in the level comparator 31 is obtained and thereafter the above described operation is repeatedly carried out.

Each of the first and second control signals Pxu and Pxd is also supplied to the driving signal generator 2 as the output signal from the control signal generator 11. The driving signals Sd supplied from the driving signal generator 2 to the fluorescent display tube 1 is composed of a group of pulse signal components which drive the fluorescent elements provided in the fluorescent display tube 1, respectively. The brightness of the display of the fluorescent elements in the fluorescent display tube 1 is changed in accordance with variations in the pulse duty factor of each of the pulse signal components which form the driving signal Sd.

The driving signal generator 2 is operative to increase the pulse duty factor of each of the pulse signal components which form the driving signal Sd in response to the first control signal Pxu which is supplied from the control signal generator 11 and to decrease the pulse duty factor of each of the pulse signal components which form the driving signal Sd in response to the second control signal Pxd which is supplied from the control signal generator 11. Accordingly, the pulse duty factor of each of the pulse signal components which form the driving signal Sd is increased so that the brightness of the display of the fluorescent elements in the fluorescent display tube 1 is increased when the external control signal Sc has its level equal to or higher than the level of the signal Sch, and is decreased so that the brightness of the display of the fluorescent elements in the fluorescent display tube 1 is decreased when the external control signal Sc has its level equal to or lower than the level of the signal Sc. As a result, the brightness of the display of the fluorescent display tube 1 is controlled in response to the level variations of the external control signal Sc.

Although, in the embodiment described above, the integrated output signal Sw supplied to the reference input terminal of the level comparator 31 is formed so as to have a level which increases exponentially during each period of time Tw and which decreasing exponentially after each period of time Tw, it is possible for the integrated output signal Sw to have a level which decreases exponentially during each period of time Tw and which increases exponentially after each period of time Tw. In such a case, the comparison output signal Po is formed so as to have a high level during a relatively long period of time when the external control signal Sc has a relatively high level in relation to the level of the integrated output signal Sw, and to have a high level during a medium period of time when the external control signal Sc has a medium level in relation to the level of the integrated output signal Sw, and to have the high level during a relatively short period of time when the external control signal Sc has a relatively low level in relation to the level of the integrated output signal Sw, and the counted result detector 19 produces the first control signal Pxu when the counting period of time during which the comparison output signal Po has the high level is longer than a third predetermined reference period of time and the second control signal Pxd when the counting period of time is shorter than a fourth predetermined reference period of time which is selected to be shorter than the third predetermined reference period.

Although the invention has been described with respect to preferred embodiments, it is not to be so limited as changes and modifications can be made which are within the full intended scope of the invention as defined by the appended claims.

I claims as my invention:
1. A signal level detecting circuit comprising:
an input terminal to which an input signal which has level variations is applied,
a level comparing means which has first and second input terminals supplied with the input signal and a reference signal, respectively, and operative to produce one of a first and a second comparison output signals, said first comparison output signal having a first level during first periods of time wherein the level of the input signal is not higher than the level of the reference signal and a second level during periods of time other than said first periods of time, and said second comparison output signal having the first level during second periods of time when the level of the input signal is not lower than the level of the reference signal and the second level during periods of time other than said second periods of time,
a control signal generating means operative to detect one of said first and second periods of time and to produce one of a pair of first and second control signals and a pair of third and fourth control signals, said first control signal being produced when the detected one of said first and second periods of time is shorter than a first reference time, said second control signal being produced when the detected one of said first and second periods of time is longer than a second reference time which is selected to be longer than said first time, said third control signal being produced when the detected one of said first and second time is longer than a third reference time, and said fourth control signal being produced when the detected one of said first and second times is shorter than a fourth reference time which is selected to be shorter than said third reference time,
a pulse generating means operative to produce a pulse signal which has a period which is based on a predetermined clock signal and a pulse duty factor which is variable during a given time at regular intermittent intervals, so as to vary the pulse duty factor of the pulse signal in a first manner when- ever one of said first and third control signals is obtained from said control signal generating means, and to vary the pulse duty factor of the pulse signal in a second manner which is different from said first manner whenever one of said second and fourth control signal is obtained from said control signal generating means, and an integrating means operative to produce an integrated output signal based on the pulse signal obtained from said pulse generating means during said given time and to supply the second input terminal of said level comparing means with the integrated output signal as said reference signal.

2. A signal level detecting circuit according to claim 1, wherein said control signal generating means comprises a counter which is supplied with one of the first and second comparison output signals from said level comparing means and which is operative to count the pulses forming another clock signal during each time during which one of said first and second comparison output signals has the first level and to produce a count output representing a counted result, and a counted result detector supplied with the count output from said counter and operative to detect the counted result represented by the count output and to produce one of said pair of first and second control signals and said pair of third and fourth control signals based on the counted result detected.

3. A signal level detecting circuit according to claim 1, wherein said integrating means comprises a capacitor connected between the reference input terminal of said level comparing means and a reference potential terminal, and a resistor with one end to which said pulse signal is supplied and the other end connected to the reference input terminal of said level comparing means.

4. A signal level detecting circuit according to claim 1 further comprising a buffer amplifier means which is connected between said pulse generating means and said integrating means.

5. A signal level detecting circuit according to claim 2 further comprising a clock generating means for supplying said pulse generating means and said counter with said predetermined clock signal and said another clock signal, respectively.

* * * * *